United States Patent [19]

Kitagawa

[11] Patent Number: 5,008,485
[45] Date of Patent: Apr. 16, 1991

[54] CONDUCTIVE SEAL

[75] Inventor: Hiroji Kitagawa, Nagoya, Japan

[73] Assignee: Kitagawa Industries Co., Ltd., Aichi, Japan

[21] Appl. No.: 419,590

[22] Filed: Oct. 10, 1989

[30] Foreign Application Priority Data

Oct. 28, 1988 [JP] Japan .................. 63-273873

[51] Int. Cl.$^5$ .............................................. H05K 9/00
[52] U.S. Cl. .......................... 174/35 GC; 174/35 MS
[58] Field of Search .......... 174/35 R, 35 GC, 35 MS, 174/424; 361/424

[56] References Cited

U.S. PATENT DOCUMENTS

| 3,296,356 | 1/1967 | McAdams | 174/35 GC |
| 3,583,930 | 6/1971 | Ehrreich et al. | 174/35 MS |
| 4,399,317 | 8/1983 | Van Dyk, Jr. | |
| 4,447,492 | 5/1984 | McKaveney | 174/35 MS |
| 4,690,778 | 9/1987 | Narumiya et al. | 174/35 MS |
| 4,720,606 | 1/1988 | Senn | |
| 4,749,625 | 6/1988 | Obayashi et al. | 174/35 MS |

FOREIGN PATENT DOCUMENTS

| 8600491 | 1/1986 | PCT Int'l Appl. |
| 2129070 | 5/1984 | United Kingdom . |
| 2174551 | 11/1986 | United Kingdom . |
| 2194579 | 3/1988 | United Kingdom . |

OTHER PUBLICATIONS

Newmann and Toomey, IBM Technical Disclosure Bulletin, vol. 17, No. 9, Feb. 1975, p. 2712.
John Severinsen, Machine Design, vol. 47, No. 19, Aug. 1975, pp. 74-77.

Primary Examiner—Leo P. Picard
Assistant Examiner—Bot Lee Ledynh
Attorney, Agent, or Firm—Oliff & Berridge

[57] ABSTRACT

The conductive seal of the present invention comprises the conductive layer and the sealing member. The conductive layer is composed only for providing conductivity, and the sealing member is composed only for providing a sealing effect. The conductive layer is such a thin coat that the conductive seal as a whole has a sufficient sealing effect, when it is applied onto the housing. Owing to such a sufficient sealing effect, the conductive layer can be securely adhered to the housing. Consequently, the conductive seal protects the electronic equipment from electromagnetic waves and prevents electromagnetic waves generated by the electronic equipment from leaking outside. The conductive layer is so thin that manufacturing cost can be reduced even when silver powder or copper powder is used for the layer.

18 Claims, 3 Drawing Sheets

CONDUCTIVE SEAL

BACKGROUND OF THE INVENTION

This invention relates to a conductive seal used for sealing an opening in a housing, especially for filling a gap between the housing of electronic equipment and its cover.

In related arts, various kinds of resins are used for a sealant. The sealant fits the gap between the housing and the cover using its rubber-like elasticity to secure the contents of the housing and prevent the contents from being interfered with from the outside. For example, an O ring made of synthetic resin or a synthetic resin packing adaptable to the configuration of the gap is used. Another known sealant is composed of pasted compound having adhesion and can also be used as an adhesive. In addition, a sealant for sealing joints in the housing of an automobile transmission, a sealant for shielding an automobile windowpane, and a sealant for sealing joints in an architectural panel are known.

The related-art seals and sealants having a rubber-like elasticity do not have conductivity. Consequently, when the seal or sealant is applied to the housing of the electronic equipment, electromagnetic waves leak in or out of the housing. Electromagnetic noise generated by the electronic equipment in the housing is transmitted outside, thus adversely affecting the equipment outside the housing. To solve this problem, the method for providing conductivity to a seal or sealant has been under consideration.

To provide conductivity to a sealant, metallic powder or carbon black can be mixed in the sealant. However, mixed solid particles like carbon black or metallic powder change the properties of sealants mainly composed of rubber or synthetic resin. If the amount of the solid particles mixed into the sealant is too small, the sealant has elongation, but it does not have tensile strength or shear strength. By mixing more solid particles into the sealant, however, the sealant becomes harder but more brittle. As a result, the sealant becomes fragile and has low flexural strength.

When a sealant is manufactured primarily for providing conductivity, a large amount of carbon black must be mixed into the sealant, thereby hardening the sealant too much. A sealant with such a composition cannot fit a gap or produce a sealing effect.

When a sufficient amount of carbon black for providing conductivity is mixed in unhardened sealant paste, the sealant becomes so viscous due to mixed carbon black that it cannot be applied to the gap to seal. To decrease the viscosity of the sealant, a solvent can be added. Even if the sealant can be applied to the gap by adding a solvent, however, the sealant is still too stiff to produce suitable sealing effect.

When metallic powder is used instead of carbon black, the sealant requires a large amount of metallic powder to enhance its conductivity, resulting in the same problem as carbon black. Moreover, since metallic powder has a high specific gravity, the specific gravity of the sealant is also increased. The required thixotropy of the sealant is thus deteriorated. When, to produce a sealing effect, the sealant is formed in a thick strand before it is applied to the gap, the sealant sags at the gap before it hardens, deteriorating the sealing effect.

Silver or copper is conductive, but expensive. It is economically unfeasible to mix a large amount of silver or copper in the sealant formed in thick strands.

SUMMARY OF THE INVENTION

The object of the present invention is to provide a conductive seal comprising a sealing member and a conductive layer.

This object is attained by the present invention, which provides a conductive seal for filling a gap between first and second surfaces. The conductive seal comprises sealing means provided on at least one of the surfaces for filling the gap between the first and second surfaces, and a conductive layer formed on a surface of the sealing means. The conductive layer is electrically connected to both surfaces.

DETAILED DESCRIPTION OF THE PREFERRED EMBODIMENTS

Figure 1:
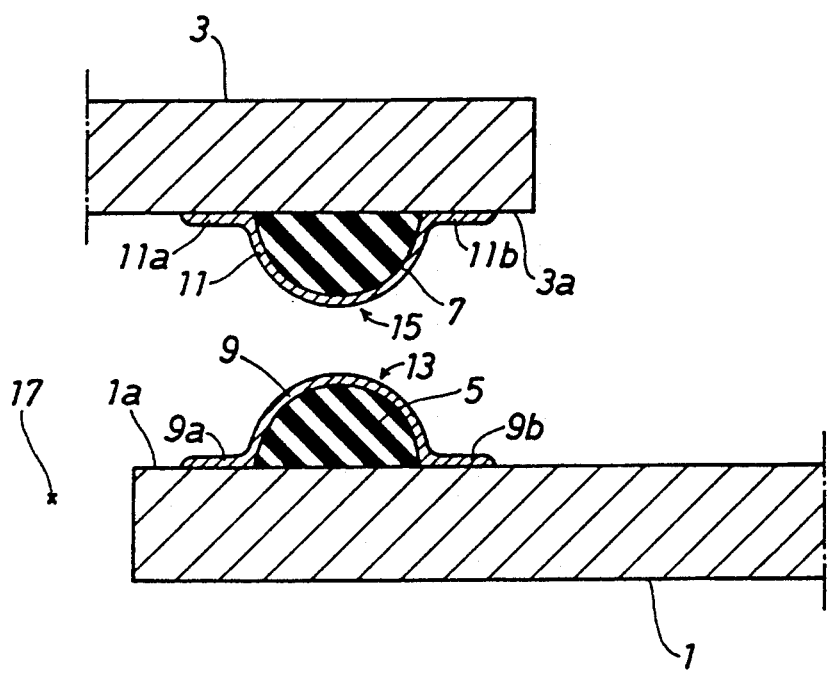
FIG. 1 is an end view of a conductive sealant for a first embodiment of the present invention.

As shown in FIG. 1, in a first embodiment, sealing members 5 and 7 composed mainly of synthetic rubber are provided in a ring form onto edges 1a and 3a of a housing 1 and a cover 3, respectively. Conductive layers 9 and 11 are provided over the sealing members 5 and 7. At least the surfaces of the housing 1 and the cover 3 are made of a conductive substance like copper. Rims 9a, 9b, 11a and 11b of the conductive layers 9 and 11 directly contact the edges 1a and 3a of the housing 1 and the cover 3, respectively. Consequently, the conductive layers 9 and 11 conduct electricity to the housing 1 and the cover 3. The conductive layer 9 and the sealing member 5 compose a conductive seal 13, and the conductive layer 11 and the sealing member 7 compose a conductive seal 15.

The conductive layers 9 and 11 are composed mainly of resin such as polyurethane resin, silicon resin, epoxy resin, vinyl chloride resin or the like, or of rubber such as chloroprene rubber, crude rubber or the like, and are mixed with metallic powder, carbon black or other conductive agent, so that the conductive layers 9 and 11 have electrical conductivity.

Instead of metallic powder or carbon black, carbon fiber can be used as a conductive agent. The carbon fiber is manufactured through a vapor-phase system by suspending ultrafine powder of high-melting metal or high-melting metal compound in the thermal decomposition zone of hydrocarbon.

The carbon fiber is whisker-shaped, as disclosed in Japan Published Examined patent application Ser. No. 62-242 and Japan Published Unexamined patent application Ser. Nos. 60-27700, 62-95351, 60-38472, and 59-179816. The high-melting metal does not gasify at 950° C. to 1300° C., the temperature range in which hydrocarbon is thermally decomposed. For the high-melting metal, available is titanium (Ti), zirconium (Zr) or the like in group IVB according to the periodic system, vanadium (V), niobium (Nb) or tantalum (Ta) in group VB, chromium (Cr), molybdenum (Mo) or the like in group VIA, manganese (Mn) or the like in group VIIB, or iron (Fe), cobalt (Co), nickel (Ni) or the like in group VIII. Metals Fe, Co, Ni, V, Nb, Ta, Ti, and Zr are best. The oxide, nitride, chloride or the like of the metals is used as the high-melting metal compound.

In addition to the above conductive agent, a filler, a plasticizer, a deterioration-preventive agent or the like can be mixed in the conductive layers 9 and 11.

Resin composing the conductive layers 9 and 11 can be selected so that it is compatible with the material of the sealing members 5 and 7. For example, when the sealing members 5 and 7 are composed mainly of polyurethane resin, urethane resin should be used for the conductive layers 9 and 11 that adhere to the sealing members 5 and 7. The sealing members 5 and 7 composed of the combination of rubber and a other than urethane resin are compatible with the conductive layers 9 and 11 composed of the same combination.

The sealing members 5 and 7 can be composed mainly of resin such as polyurethane resin, silicone resin, vinyl chloride resin or the like, or rubber such as chloroprene rubber, crude rubber or the like. A filler, a plasticize, a deterioration-preventive agent, or the like can be mixed as required. The sealing members 5 and 7 have a general composition as a sealing member.

A liquefied conductive compound is sprayed and dried onto the sealing members 5 and 7 through a known method to form the conductive layers 9 and 11 on the sealing members 5 and 7 formed in a ring shape on the edges 1a and 3a of the housing 1 and the cover 3, respectively.

The sealing members 5 and 7 can be mechanically engaged with or adhered using an adhesive onto the edges 1a and 3a. Alternatively, to form the sealing members 5 and 7, a pasted compound is applied in the form of a properly thick strand of beads onto the edges 1a and 3a to which primer has been applied, then hardened through crosslinking, thus generating the rubber-like elasticity.

After forming the sealing members 5 and 7 onto the edges 1a and 3a of the housing 1 and the cover 3, the conductive layers 9 and 11 can be formed by applying a liquefied composition over the sealing members 5 and 7.

Figure 2:
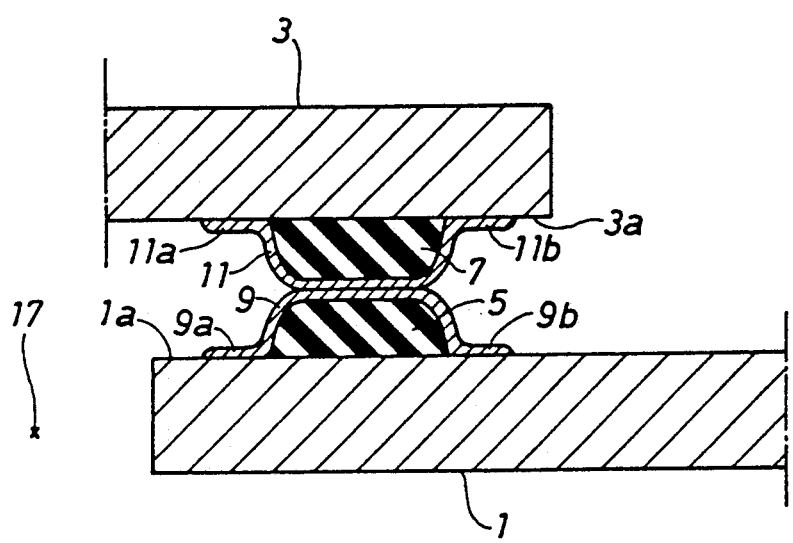
FIG. 2 is an end view of the conductive sealant for the first embodiment when a cover member closes an opening in a housing member via the conductive sealant.

In operation, when the cover 3 having the conductive seal 15 closes an opening 17 in the housing 1 having the conductive seal 13, as shown in FIG. 2, the conductive seals 13 and 15 contact each other via the conductive layers 9 and 11. The conductive layers 9 and 11 have little sealing effect. However, since the conductive layers 9 and 11 are thin coats over the sealing members 5 and 7, the conductive seals 13 and 15 provide sufficient sealing effect.

The conductive seals 13 and 15 provide a sufficient sealing effect, and the conductive layers 9 and 11 are adhered over the edges 1a and 3a. Therefore, the conductive layers 9 and 11 between the housing 1 and the cover 3 protect the electronic equipment in the housing 1 from electromagnetic waves, and prevent electromagnetic waves generated by the electronic equipment from leaking outside.

Figure 3:
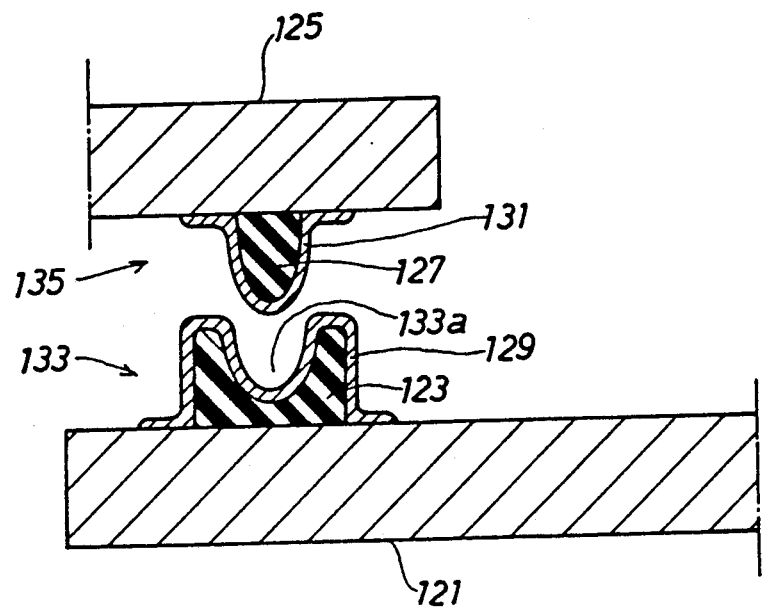
FIG. 3 is an end view of a conductive sealant for a second embodiment of the present invention.

As shown in FIG. 3, in a second embodiment, a sealing member 127 having a convex cross section is formed on a cover 125, and a sealing member 123 having a concave cross section is formed on a housing 121. In the same way as the first embodiment, conductive layers 129 and 131 thinly coat the surfaces of the sealing members 123 and 127.

Figure 4:
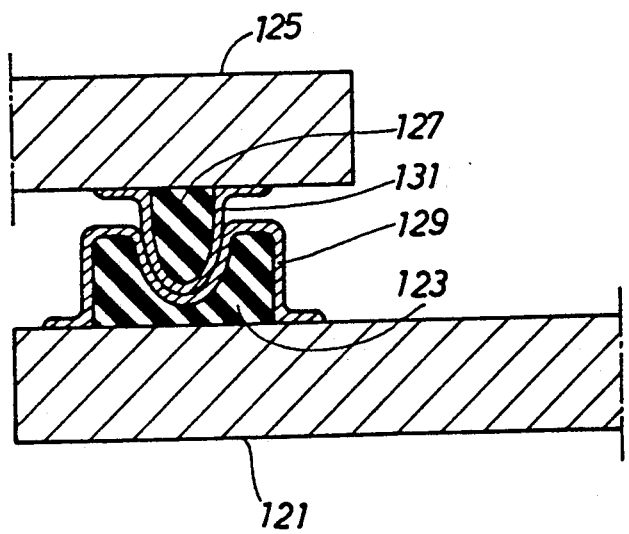
FIG. 4 is an end view of the conductive sealant for the second embodiment when a cover member closes an opening in a housing member via the conductive sealant.

In operation, as shown in FIG. 4, when the cover 125 closes an opening in the housing 121, a hollow 133a of a conductive seal 133 receives a conductive seal 135, thereby filling the gap between the housing 121 and the cover 125 more closely than in the first embodiment. As compared with the first embodiment, the conductive layers 129 and 131 electrically contact a wider area, and more electromagnetic-shielding effect can be expected.

Figure 5:
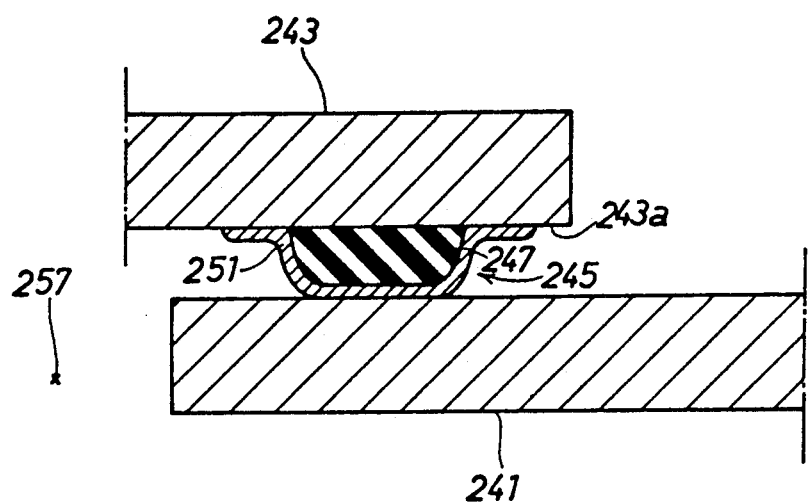
FIG. 5 is an end view of a conductive sealant for a third embodiment of the present invention when a cover member closes an opening in a housing member via the conductive sealant.

In a third embodiment, as shown in FIG. 5, a housing 241 is not provided with a conductive seal. A conductive seal 245 comprising a sealing member 247 and a conductive layer 251 is provided on an edge 243a of a cover 243. Such a simple structure can produce a electromagnetic-shielding effect by engaging the conductive seal 245 with the surface of the housing 241 when the cover 243 closes an opening 257 in the housing 241. Alternatively, the conductive seal 245 can be applied only onto the surface of the housing 241 instead of the cover 243.

The conductive seal of the present invention seals the housing of the electronic equipment to protect the electronic equipment from dust, particles, moisture and toxic gas, and functions as a shielding material to prevent electromagnetic waves from entering or leaking from the electronic equipment in the housing. Since the surface of the conductive seal conducts electricity, it can also be used as an electrostatic discharge shielding material to protect the electronic equipment from static electricity. In combination with a magnetic substance, the conductive seal can be used as an electromagnetic-interference shielding material to protect the electronic equipment or a magnetic recording element from electromagnetic waves.

Although specific embodiments of the invention have been shown and described for the purpose of illustration, the invention is not limited to the embodiments illustrated and described. This invention includes all embodiments and modifications that come within the scope of the claims.

What is claimed is:

1. A conductive seal for filling a gap between first and second surfaces comprising:

sealing means provided on at least one of the surfaces for filling the gap between the first and second surfaces, said sealing means comprising a material selected from a first group consisting of natural and synthetic resins;

a conductive layer formed on a surface of the sealing means, where the conductive layer is electrically connected to both surfaces, said conductive layer compatible with said sealing means and comprising a material selected from a second group comprising resinous material selected from said first group; and a conductive agent mixed into said material of said conductive layer, said conductive agent comprising a material selected from a group consisting of metallic powder, carbon black and carbon fiber.

2. The conductive seal of claim 1, wherein the sealing means and conductive layer are attached to the first surface and contact the second surface.

3. The conductive seal of claim 1, wherein the first surface is a conductive surface on a housing member, the second surface is a conductive surface on a cover member, and the cover member electromagnetically seals an opening in the housing member when the sealing means fills the gap between the two surfaces.

4. The conductive seal of claim 3, wherein the cover member mechanically seals the opening in the housing member when the sealing means fills the gap between the first and second surfaces.

5. The conductive seal of claim 3, wherein the housing member contains electrical equipment.

6. The conductive seal of claim 1, wherein the sealing means and the conductive layer are composed of the same natural resin.

7. The conductive seal of claim 1, wherein the sealing means and the conductive layer are composed of the same synthetic resin.

8. The conductive seal of claim 1, wherein said carbon fiber is manufactured by a vapor-phase system such that it comprises a core comprising a metal from the group consisting of titanium, zirconium, vanadium, niobium, tantalum, chromium, molybdenum, manganese, iron, cobalt, nickel, and the oxides, nitrides, and chlorides of the metals.

9. A conductive seal for filling a gap between first and second surfaces, comprising:
   first and second sealing means for filling the gap between the two surfaces, the first sealing means provided on the first surface and the second sealing means provided on the second surface, said first and second sealing means comprising a material selected from a first group consisting of natural and synthetic resins; and
   first and second conductive layers, the first conductive layer formed on a surface of the first sealing means and electrically contacting the first surface and the second conductive layer formed on a surface of the second sealing means and electrically contacting the second surface, said first and second conductive layers compatible with said first and second sealing means respectively and comprising a material selected from a group comprising resinous materials selected from said first group, said material containing a conducting agent;
   where the first and second sealing means fill the gap between the first and second surfaces, and the first and second conductive layers electrically contact each other when the first and second sealing means fill the gap between the first and second surfaces.

10. The conductive seal of claim 9, wherein the first sealing means and first conductive layer are attached to the first surface and the second sealing means and second conductive layer are attached to the second surface.

11. The conductive seal of claim 9, wherein the first surface is a conductive surface on a cover member, the second surface is a conductive surface on a housing member, and the cover member electromagnetically seals an opening in the housing member when the first and second sealing means fill the gap between the first and second surfaces.

12. The conductive seal of claim 11, wherein the cover member mechanically seals the opening in the housing member when the first and second sealing means fill the gap between the first and second surfaces.

13. The conductive seal of claim 11, wherein the housing member contains electrical equipment.

14. The conductive seal of claim 9, wherein the sealing means and the conductive layer are composed of the same natural resin.

15. The conductive seal of claim 9, wherein the sealing means and the conductive layer are composed of the same synthetic resin.

16. The conductive seal of claim 9, wherein the conductive agent is carbon fiber.

17. The conductive seal of claim 16, wherein said carbon fiber is manufactured by a vapor-phase system such that it comprises a core comprising a metal from the group consisting of titanium, zirconium, vanadium, niobium, tantalum, chromium, molybdenum, manganese, iron, cobalt, nickel, and the oxides, nitrides, and chlorides of the metals.

18. The conductive seal of claim 9, wherein the first sealing means has a protruding portion and the second sealing means has a depression formed to receive the protruding portion of the first sealing means when the first and second sealing means fill the gap between the first and second surfaces.

* * * * *